(12) United States Patent
Gektin et al.

(10) Patent No.: US 6,836,408 B2
(45) Date of Patent: Dec. 28, 2004

(54) METHOD AND APPARATUS FOR FORCE TRANSFER VIA BARE DIE PACKAGE

(75) Inventors: Vadim Gektin, San Jose, CA (US); James A. Jones, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 87 days.

(21) Appl. No.: 10/247,503

(22) Filed: Sep. 19, 2002

(65) Prior Publication Data

US 2004/0057213 A1 Mar. 25, 2004

(51) Int. Cl.[7] .................................................. H05H 7/20
(52) U.S. Cl. ..................... 361/704; 165/80.2; 165/80.3; 165/185; 257/707; 257/712; 257/719; 361/710; 361/719; 361/720
(58) Field of Search ................................. 257/706–707, 257/712–713, 718–719, 726–727; 165/80.2, 80.3, 185; 361/704–710, 719–722

(56) References Cited

U.S. PATENT DOCUMENTS

| | | | | |
|---|---|---|---|---|
| 5,450,283 A | * | 9/1995 | Lin et al. ..................... | 361/704 |
| 6,229,702 B1 | * | 5/2001 | Tao et al. ..................... | 361/704 |
| 6,390,475 B1 | * | 5/2002 | Eckblad et al. .............. | 277/312 |
| 6,442,026 B2 | * | 8/2002 | Yamaoka ..................... | 361/704 |

* cited by examiner

Primary Examiner—Gregory Thompson
(74) Attorney, Agent, or Firm—Zagorin, O'Brien & Graham LLP

(57) ABSTRACT

The present application describes a method and an apparatus for facilitating increased uniformity and diffusion of force transfer on a bare die electronic package for example, when such electronic package is attached to a circuit board. Additional force absorbent material is applied around a bare die in the bare die electronic package. The force applied to the bare die electronic package can be distributed to the additional force absorbent material. A curable force absorbent material is dispensed around the bare die in the bare die electronic package. The surface of the curable material is substantially parallel with the surface of bare die thus facilitating a substantially uniform force distribution through the bare die and curable material resulting in a robust bare die electronic package.

31 Claims, 5 Drawing Sheets

(Cross sectional view)

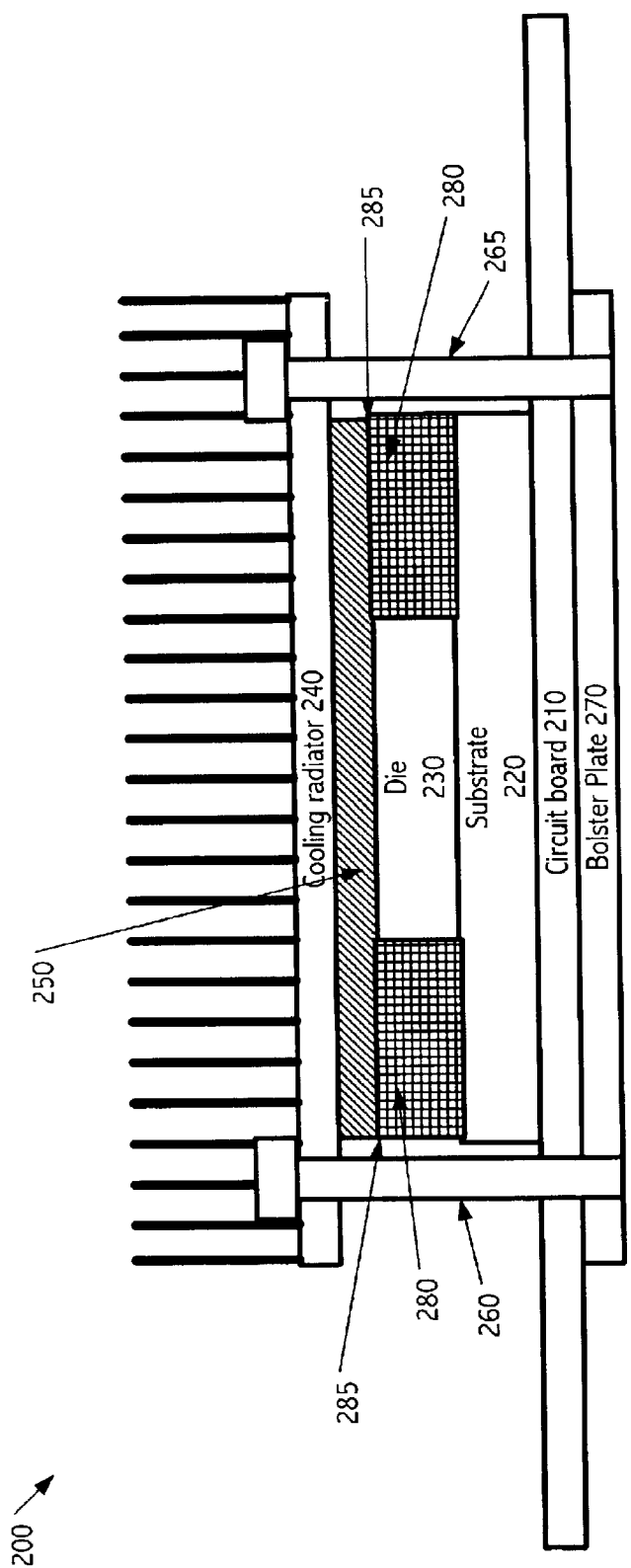
Fig. 2A (Cross sectional view)

Fig. 2B (Top view)

METHOD AND APPARATUS FOR FORCE TRANSFER VIA BARE DIE PACKAGE

BACKGROUND

1. Field of the Invention

The present invention relates to electronic packaging and more specifically to bare die electronic packaging.

2. Description of the Related Art

Generally, integrated circuits are packaged using electronic packages with a lid (lidded) or without a lid (lidless or bare). In lidded electronic packaging, the lid serves as cover for the integrated circuit die to prevent structural damages and provides a mechanism to transfer force from the top of the electronic package to a circuit board on which the electronic package is installed. For bare or lidless electronic packages, the force transfer occurs through the integrated circuit die itself. The magnitude of force applied to the bare electronic package is typically smaller than the lidded electronic package to insure the structural integrity of the integrated circuit die.

Bare electronic packages have thermal advantage over lidded electronic packages. Eliminating the lid and thermal interface material from the lidded electronic package provides lower thermal resistance and better thermal performance for bare electronic package. Better thermal performance is critical for electronic packages with higher total power dissipation. Therefore, electronic circuits with high total power dissipation are typically packaged using bare electronic packaging. However, the amount of force that can be used on bare electronic packages is limited compared to the lidded electronic package. The limited force applicability can result in improper function such as, for example, the electronic package may not be properly inserted into a circuit board, or a cooling radiator may not establish proper conductive interface with the integrated circuit die resulting in poor thermal performance.

FIG. 1A illustrates an example of a typical use of a bare die electronic package with a cooling radiator. A circuit board assembly 100 includes a circuit board 110. A bare die electronic package with a substrate 120 and a bare die 130 is coupled to circuit board 110. Bare die 130 conductively interfaces with a cooling radiator 140 via a thermal interface material 150. Bare die 130 may not provide enough surface contacts for cooling radiator 140 for proper attachment. Thus, additional fastening mechanism is used for cooling radiator 140. Typically, cooling radiator 140 is further strengthened by two fastening bolts 170 and 175. However, other conventional means can be used to fasten cooling radiator 140. Often, bolts 170 and 175 cannot be fastened directly on circuit board 110 (e.g., due to the circuit layout, other electronic components, or the like) therefore, an additional bolster plate 160 is used to provide support for bolts 170 and 175.

The typical arrangement shown in FIG. 1A results in empty space 180 around bare die 130 under cooling radiator 140. Empty space 180 limits the amount of force that can be applied using bolts 170 and 175. Because empty space 180 does not provide guiding support underneath cooling radiator 140, applying additional fastening force on bolts 170 and 175 can result in the bending of cooling radiator 140 or it can cause structural damage to bare die 130. Empty space 180 around bare die 130 limits the amount of force that can be applied on bare die 130.

FIG. 1B illustrates the top view of circuit board 110 without cooling radiator 140. The surface area with thermal interface material 150 on bare die 130 is generally smaller compared to empty space 180 around bare die 130 on substrate 120. When a force is applied to bolts 170 and 175 to fasten cooling radiator 140 to bare die 130 then due to empty space 180 around bare die 130, the force is centered on bare die 130. To prevent the structural integrity of bare die 130, the amount of force that can be applied using bolts 170 and 175 is often significantly limited. The limited force can leave cooling radiator 140 without a proper conductive interface with bare die 130 and can cause poor thermal performance for bare die 130. Similarly, when cooling radiators are not needed for some bare electronic packages, the amount of force that can be applied to insert bare electronic packages into circuit boards can also be limited resulting in improper functioning of the integrated circuits. Therefore, a method and an apparatus are needed to allow parallel force transfer through a bare die electronic package.

SUMMARY

In some embodiments, the present application describes a method and an apparatus for facilitating increased uniformity and diffusion of force transfer on a bare die electronic package for example, when such electronic package is attached to a circuit board. Additional force absorbent material is applied around a bare die in the bare die electronic package. The force applied to the bare die electronic package can be distributed to the additional force absorbent material. A curable force absorbent material is dispensed around the bare die in the bare die electronic package. The surface of the curable material is substantially parallel with the surface of bare die thus facilitating a substantially uniform force distribution through the bare die and curable material 0resulting in a robust bare die electronic package.

In an embodiment, a method in connection with electronic packaging is described. In some variations, the method includes dispensing a curable material, substantially covering an area around a die in a bare die electronic package, wherein a surface of the curable material is substantially parallel with a surface of the die. In some variation, the die is integral with a substrate. According to an embodiment, the bare die electronic package is installed on a circuit board. In an embodiment, the method includes curing the curable material. In some variation, the curable material substantially forms a frame around the die.

In an embodiment, an electronic package is described. According to an embodiment, the electronic package includes a die and a substrate integral with the die. In some variation, a curable material is dispensed substantially around the die and a surface of the curable material is substantially parallel with a surface of die. In some variation, the electronic package is a bare die electronic package. In some variation, the electronic package is installed on a circuit board. In some variation, the curable material forms a frame around the die on the substrate. In some variation, the frame substantially covers the substrate.

BRIEF DESCRIPTION OF THE DRAWINGS

The present invention may be better understood, and its numerous objects, features, and advantages made apparent to those skilled in the art by referencing the accompanying drawings.

FIG. 2A illustrates an example of a bare die electronic package according to one embodiment of the present invention.

FIG. 2B is top view of a circuit board without a cooling radiator and interface material according to one embodiment of the present invention.

The use of the same reference symbols in different drawings indicates similar or identical items.

DESCRIPTION OF THE PREFERRED EMBODIMENT(S)

Figure 1A:
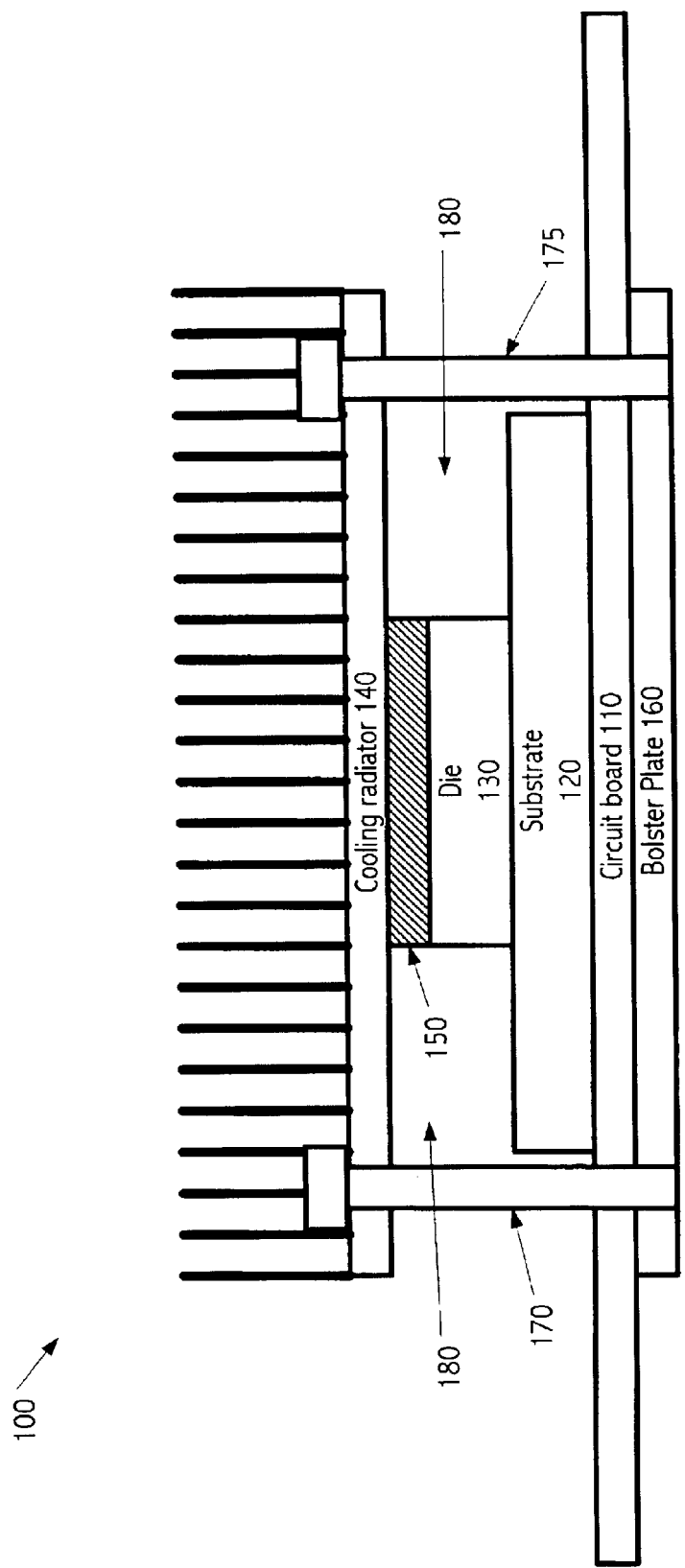
FIG. 1A illustrates an example of a typical use of a bare die electronic package with a cooling radiator.
Figure 1B:
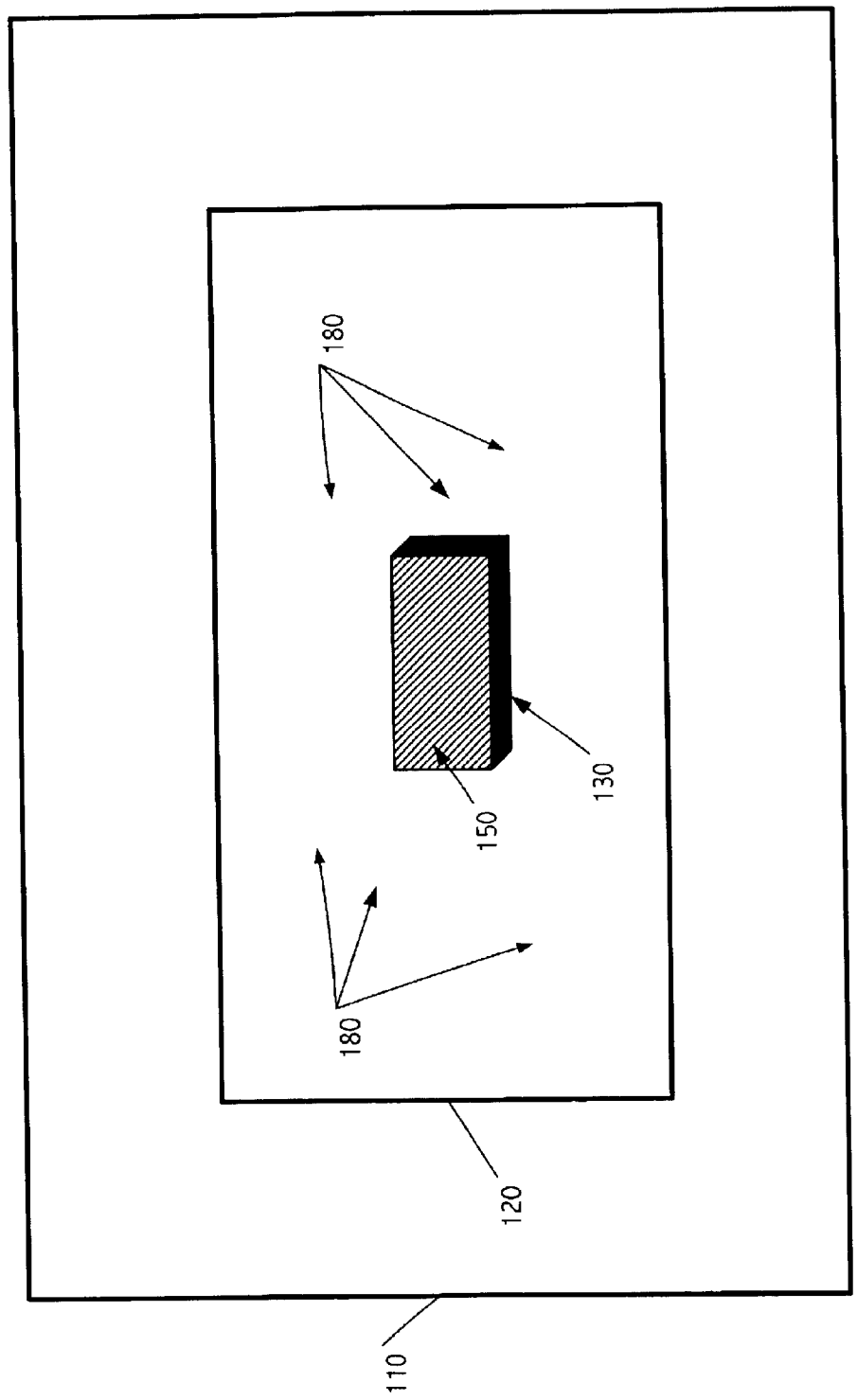
FIG. 1B illustrates the top view of a circuit board with bare die and without a cooling radiator.

FIG. 2A illustrates an example of a bare die electronic package according to one embodiment of the present invention. For purposes of illustration, one bare die electronic package on a circuit board is shown however one skilled in art will appreciate that the circuit board can include various electronic components (e.g., passive, active, integrated circuits or the like). A circuit board assembly 200 includes a circuit board 210. A bare die electronic package with a substrate 220 and a die 230 is coupled to circuit board 210. A curable material 280 is dispensed around die 230 such that it covers the remaining area on substrate 220 around die 230. Curable material 280 can be any curable material (e.g., Hysol EA9360/9377, Permabond E04/E32 or the like). Curable material 280 can be force absorbent and can be dispensed around die 230 using conventional means. The surfaces 285 of curable material 280 are substantially in parallel with the surface of die 230. This allows substantially parallel force distribution from the top of the package.

A cooling radiator 240 is attached to die 230 and curable material 280 via interface material 250. Interface material 250 can be any conventional interface material (e.g., adhesive, thermal or the like). Some commonly used interface materials are Thermoset MT-315, Shin-Etsu G571, Bergquist TIC7500 or the like. Cooling radiator 240 is further fastened via two bolts 260 and 265 using a bolster plate 270 which is attached to circuit board 210. For purposes of illustration, bolster plate 270 is used to provide support for cooling radiator 240; however, any conventional fastening means can be used to attach cooling radiator 240 to die 230 and circuit board 210. When force is applied from the top (e.g., by fastening bolts 260 and 265, inserting or otherwise assuring electrical contact of the electronic package with circuit board 210 or the like) then due to additional support of curable material 280, the force is distributed substantially across the top of die 230 and curable material 280 thereby protecting structural integrity of die 230. Because of curable material 280 around die 230, additional force can be applied on the electronic package without affecting the structural integrity of die 230.

FIG. 2B is a top view of circuit board 210 without cooling radiator 240 and interface material 250 according to an embodiment of the present invention. The empty space on substrate 220 around die 230 is substantially covered with curable material 280. The surfaces of curable material 280 are substantially leveled with the surface of die 230 so that such surfaces provide a substantially flat surface for force transfer from the top in FIG. 2A.

Figure 2C:
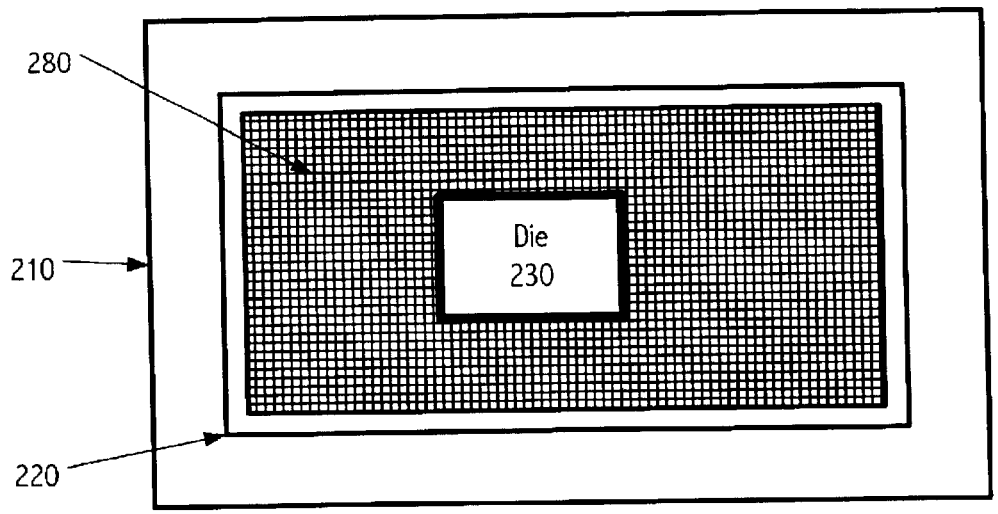
FIG. 2C illustrates an example of a frame formed around a die by a curable material according to one embodiment of the present invention.
Figure 2C:
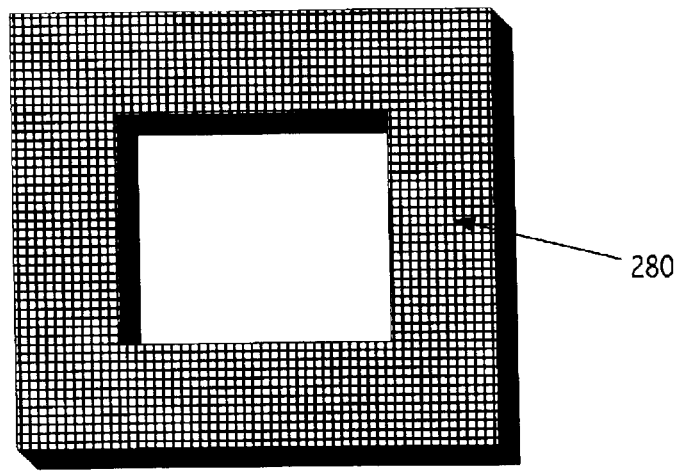

FIG. 2C illustrates an example of a frame formed around die 230 by curable material 280 according to one embodiment of the present invention. Curable material 280 forms a frame that is substantially as deep as the height of die 230 to provide a substantially parallel surface on the top for force distribution. The frame formed by curable material 280 preferably substantially covers the surface of substrate; however, the size of the frame of curable material 280 can be configured in any appropriate way to provide appropriate force distribution on the electronic package. For example, the frame of curable material 280 can be configured to provide support for cooling radiator 240. For purposes of illustration, in the present example, while die 230 is shown to be of a particular form and shape, one skilled in art will appreciate that die 230 can be of any form and shape. Further, die 230 can be positioned in various ways on substrate 220 as required by the underlying integrated circuit. Further, a uniform interface material is shown, however, the interface material can be a combination of various interface materials (e.g., adhesive, thermal or the like) generally used in the art and/or include discontiguous segments of material.

Figure 3:
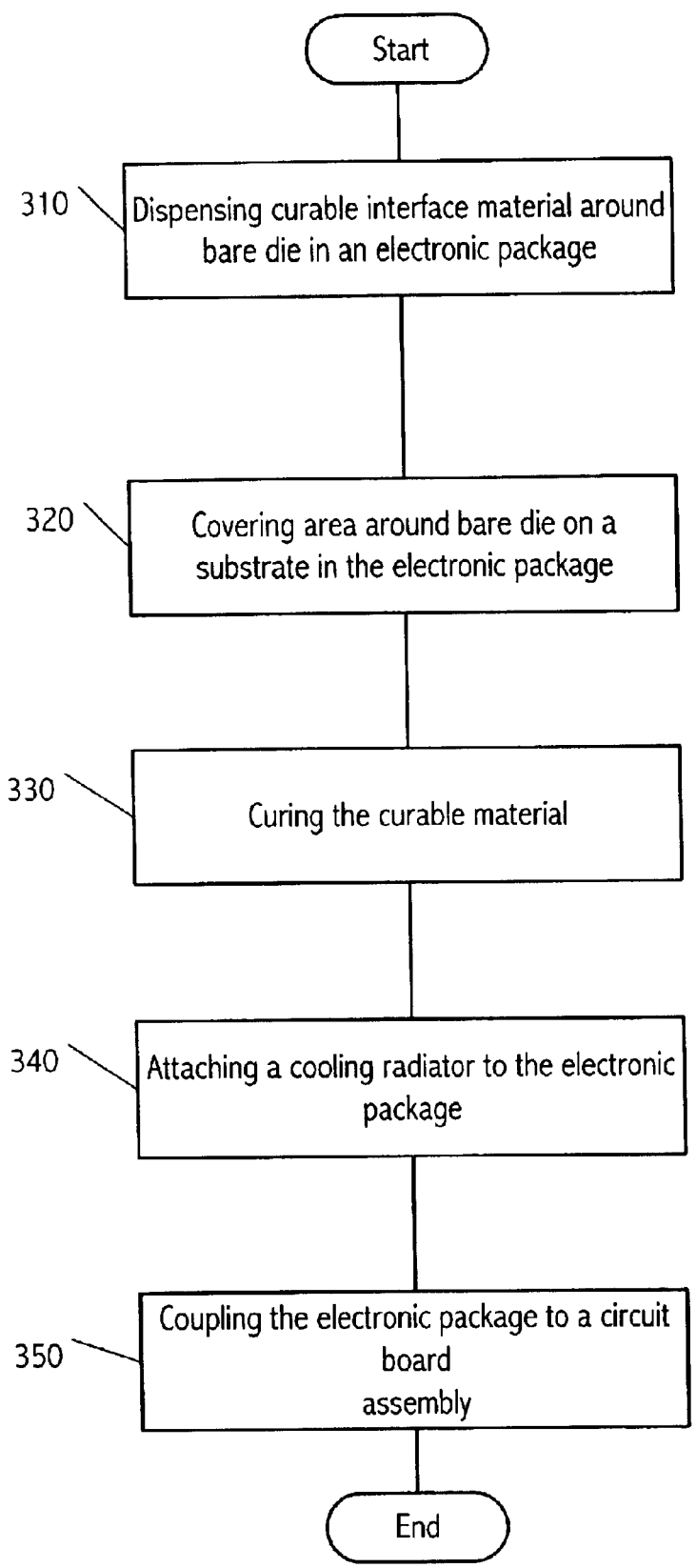
FIG. 3 is a flow diagram illustrating an exemplary sequence of operations performed during a process of forming a force transfer support for a bare die electronic package according to an embodiment of the present invention.

FIG. 3 is a flow diagram illustrating an exemplary sequence of operations performed during a process of forming a force transfer support for a bare die electronic package according to an embodiment of the present invention. While the operations are described in a particular order, the operations described herein can be performed in other sequential orders (or in parallel) as long as dependencies between operations allow. In general, a particular sequence of operations is a matter of design choice and a variety of sequences can be appreciated by persons of skill in art based on the description herein.

Initially, process dispenses curable interface material around bare die in an electronic package (310). Some commonly used curable interface materials are Thermoset MT-315, Shin-Etsu G571, Bergquist TIC7500 or the like. The process covers the area around bare die on the substrate of the electronic package (320). The curable interface material can be dispensed on the substrate according to the force distribution requirement for the electronic package. For example, if the applicable force can be concentrated on certain identified areas of the electronic package then the curable interface material can be dispensed on those identified area leaving rest of the substrate uncovered providing open heat dissipation areas in the electronic package. Similarly, if the bare die on the substrate is configured to substantially cover one side of the substrate then the curable interface material can be dispensed on the opposite side of the bare die leaving open space between the bare die and the curable interface material. One skilled in the art will appreciate that the curable interface material can be dispensed in various forms according to the configuration and the force distribution requirements of the electronic package.

The process cures the curable interface material (330). The curable interface material can be cured according to the procedure specified by the manufacturer of the curable interface material. The process attaches a cooling radiator to the electronic package (340). The cooling radiator can be attached to the electronic package according to various methods known in the art. The process couples the electronic package to a circuit board assembly (350). The electronic package can be coupled to the circuit board assembly according to the electronic package technology (e.g., through holes, ball grid array or the like). While for illustration purposes, in the present example, a cooling radiator and a circuit board assembly are described, one skilled in the art will appreciate that a cooling radiator may not be needed when appropriate cooling mechanism for the electronic package is provided.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

What is claimed is:

1. A method in connection with electronic packaging comprising:

dispensing a curable material onto a packaging substrate supporting a bare die, the curable material dispensed according to force-distribution properties of the electronic package, wherein a surface of said curable material is substantially parallel with an exposed surface of said die.

2. The method of claim 1, wherein said die is integral with a substrate.

3. The method of claim 2, further comprising:

installing said bare die electronic package on a circuit board.

4. The method of claim 1, further comprising:

forming said curable material in a continuous frame around said die.

5. The method of claim 4, wherein said frame substantially covers said substrate.

6. The method of claim 1, further comprising curing said curable material.

7. The method of claim 3, further comprising:

attaching a cooling radiator to said die.

8. The method of claim 7, wherein said cooling radiator is attached via at least one interface material.

9. The method of claim 7, further comprising:

fastening said cooling radiator to said circuit board.

10. The method of claim 1, wherein the dispensing a curable material includes dispensing the curable material onto a portion of the packaging substrate to form a support structure unattached to the bare die.

11. The method of claim 1, wherein the bare die is supported on a first portion of the packaging substrate, and wherein dispensing a curable material includes dispensing the curable material onto the packaging substrate to form a support structure on at least one and no more than three sides of the bare die.

12. The method of claim 1, wherein the dispensing a curable material includes dispensing the curable material to form a support structure covering substantially less than an entire exposed surface of the packaging substrate.

13. An apparatus comprising:

an electronic package including:
 a die; and
 a substrate integral with said die; and
a curable material wherein said curable material is dispensed onto the substrate according to force-distribution properties of the electronic package, and a surface of said curable material is substantially parallel with exposed surface of the die.

14. The apparatus of claim 13, wherein said electronic package is a bare die electronic package.

15. The apparatus of claim 13, wherein said electronic package is installed on a circuit board.

16. The apparatus of claim 13, wherein said curable material forms a frame around said die on said substrate.

17. The apparatus of claim 15, wherein a cooling radiator is coupled to said die and said curable material.

18. The electronic package of claim 17, wherein said cooling radiator is fastened to said circuit board.

19. The apparatus of claim 13, wherein the bare die is supposed on a first portion of the substrate, and the curable material forms a support structure on a least one and no more than three sides of the bare die.

20. The apparatus of claim 13, wherein the curable material forms a support structure covering substantially less than an entire exposed surface of the substrate.

21. A circuit board assembly comprising:

a circuit board; and a bare die electronic package coupled to said circuit board, wherein a curable material is dispensed onto a substrate supporting a bare die, the curable material dispensed according to force-distribution properties of the electronic package, and wherein a surface of said curable material is substantially parallel with an exposed surface of said die.

22. The circuit board assembly of claim 21, wherein the curable material forms a support structure having discontiguous segments.

23. The circuit board assembly of claim 21, wherein said die is integral with a substrate.

24. The circuit board assembly of claim 21, wherein said curable material forms a frame around said die on said substrate; and said frame substantially covers said substrate.

25. The circuit board assembly of claim 21, further comprising:

a cooling radiator attached to said die.

26. The circuit board assembly of claim 25, wherein said cooling radiator is fastened to said circuit board.

27. The circuit board assembly of claim 21, wherein the bare die is supported on a first portion of the substrate, and the curable material forms a support structure on at least one and no more than three sides of the bare die.

28. The circuit board assembly of claim 21, wherein the curable material forms a support structure covering substantially less than an entire exposed surface of the substrate.

29. An apparatus comprising:

an electronic package including:
 a die; and
 a substrate integral with said die; and
a curable material wherein said curable material is dispensed onto the substrate according to force-distribution, properties of the electronic package to form a support structure unattached to the bare die and substantially parallel with an exposed surface of the die.

30. The apparatus of claim 29, wherein the curable material forms a support structure covering substantially less than an entire exposed surface of the substrate.

31. The apparatus of claim 29, further including a cooling radiator coupled to said die and said curable material.

* * * * *

UNITED STATES PATENT AND TRADEMARK OFFICE
CERTIFICATE OF CORRECTION

PATENT NO. : 6,836,408 B2
DATED : December 28, 2004
INVENTOR(S) : Vadim Gektin et al.

It is certified that error appears in the above-identified patent and that said Letters Patent is hereby corrected as shown below:

Column 5,
Line 14, after "dispensed" insert -- onto the packaging substrate to form a support structure having discontiguous segments --.
Line 57, after "electronic package," insert -- substantially around said die to form a support structure having discontiguous segments --.
Line 57, after "and" insert -- wherein --.

Column 6,
Line 21, after "electronic package," insert -- to form a support structure unattached to the bare die --.
Line 29, after "with" delete "a" and replace with -- said --.

Signed and Sealed this

Twelfth Day of July, 2005

JON W. DUDAS
*Director of the United States Patent and Trademark Office*